United States Patent
Piemonte et al.

(10) Patent No.: US 10,224,450 B2
(45) Date of Patent: Mar. 5, 2019

(54) SILICON RESISTOR SILICON PHOTOMULTIPLIER

(71) Applicant: Avago Technologies International Sales Pte. Limited, Singapore (SG)

(72) Inventors: Claudio Piemonte, Trento (IT); Alberto Giacomo Gola, Trento (IT); Giovanni Paternoster, Trento (IT); Fabio Acerbi, Moglia (IT)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 15/634,978

(22) Filed: Jun. 27, 2017

(65) Prior Publication Data

US 2018/0374978 A1    Dec. 27, 2018

(51) Int. Cl.

| H01L 31/107 | (2006.01) |
| H01L 31/02 | (2006.01) |
| H01L 31/0216 | (2014.01) |
| H01L 27/144 | (2006.01) |
| H01L 49/02 | (2006.01) |
| G01J 1/44 | (2006.01) |

(52) U.S. Cl.
CPC .............. *H01L 31/107* (2013.01); *G01J 1/44* (2013.01); *H01L 27/1443* (2013.01); *H01L 27/1446* (2013.01); *H01L 28/20* (2013.01); *H01L 31/02005* (2013.01); *H01L 31/02027* (2013.01); *H01L 31/02161* (2013.01); *G01J 2001/4466* (2013.01)

(58) Field of Classification Search
CPC .............................. H01L 31/107; H01L 28/20
USPC .......................................................... 257/437
See application file for complete search history.

(56) References Cited

U.S. PATENT DOCUMENTS

| 9,160,949 | B2 | 10/2015 | Zhang et al. |
| 2012/0153423 | A1 | 6/2012 | Lee |
| 2013/0099346 | A1* | 4/2013 | Choong .............. H01L 27/1446 257/437 |
| 2013/0249035 | A1 | 9/2013 | Hedler et al. |

* cited by examiner

*Primary Examiner* — Anthony Ho
(74) *Attorney, Agent, or Firm* — Sheridan Ross P.C.

(57) ABSTRACT

A semiconductor device, silicon photomultiplier, and sensor are described. The disclosed semiconductor device is disclosed to include a substrate, a photosensitive area provided on the substrate, the photosensitive area corresponding to an area in which an electrical signal is generated in response to light impacting the photosensitive area, at least one trench substantially surrounding the photosensitive area, the at least one trench extending at least partially into the substrate, and a resistor confined by the at least one trench and in electrical communication with the active area such that the resistor is configured to carry electrical signals generated by the photosensitive area to a metal contact.

19 Claims, 9 Drawing Sheets

SILICON RESISTOR SILICON PHOTOMULTIPLIER

FIELD OF THE DISCLOSURE

The present disclosure is generally directed toward semiconductor device and particularly directed toward a silicon photomultiplier.

BACKGROUND

Silicon photomultipliers (SiPMs) are becoming of prominent interest in applications where detection of very low light levels and fast timing are required. A SiPM is composed of a large number of identical, small avalanche photodiodes (APD) connected in parallel, each one provided with a quenching resistor connected in series. The quenching resistor value should be in the order of 105-106 Ohm for an effective quenching of the microcell current after an avalanche is triggered (e.g., by a photon or by thermal generation).

Different technologies and designs have been proposed to build a resistor with such specs that can also be easily integrated in the single microcell: polysilicon, thin metal film, vertical bulk silicon, buried silicon. Unless it is perfectly transparent to light or beneath the active area, the quenching resistor should be placed at the border region of the APD cell and have small dimensions (few μm2) in order to minimize the Fill Factor (FF) loss.

Currently, the most common technique to build the resistors is by means of lightly doped poly-Si strips connected to the junction at one end and to the metal layer at the other end. Another way to make the resistors is by means of thin metal films, deposited by using Atomic Layer Deposition (ALD) or Sputtering techniques.

Although both of these techniques allow the realization of quenching resistors with the required specifications in terms of dimension and resistance, they introduce a complication in the fabrication process that negatively impacts the production cost, yield, and reliability. As an example, the complete realization of the poly-Si resistor requires several major fabrication steps including: Poly deposition, Poly doping, and at least 3 photolithographic steps required for resistor/spad contact definition, resistor definition and poly doping enrichment of the polySi/c-Si contact region. Moreover, at least two dielectric layers are needed to isolate the poly layer from both the silicon substrate and the metal grid connecting the SPADs matrix.

Another issue of the poly resistor in certain applications is its high temperature dependence.

Concerning the thin metal film, the main issue is the fact that it is not a standard CMOS process.

The SiPM features low-voltage operation, insensitivity to magnetic fields, mechanical robustness and excellent uniformity of response. Due to these traits, the SiPM has rapidly gained acceptance in the fields of medical imaging, hazard and threat detection, biophotonics, high energy physics and LIDAR.

BRIEF DESCRIPTION OF THE DRAWINGS

The present disclosure is described in conjunction with the appended figures, which are not necessarily drawn to scale.

DETAILED DESCRIPTION

Figure 1A:
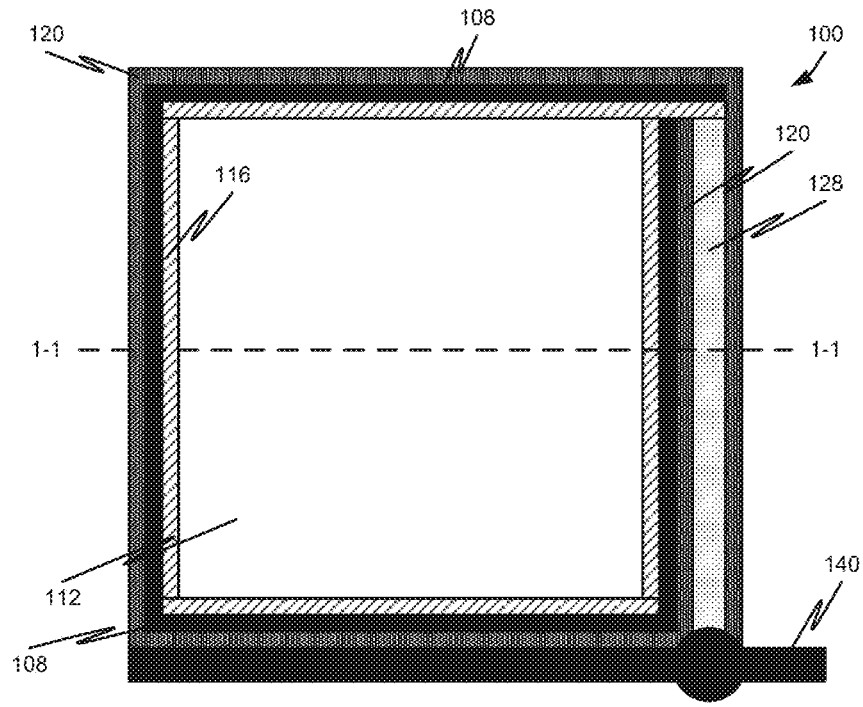
FIG. 1A is a top view of a first illustrative semiconductor device in accordance with at least some embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-9, various configurations of semiconductor devices, silicon photomultipliers, silicon photomultiplier circuits, light sensors, and the like are depicted and described. Although some of the devices depicted in the figures correspond to intermediate devices or portions of devices, one of ordinary skill in the art will appreciate that any of the devices or systems can be considered a semiconductor device or silicon photomultiplier without departing from the scope of the present disclosure.

In some embodiments, a silicon photomultiplier is proposed to include an improved SPAD design, featuring a quenching resistor integrated in the silicon substrate around the border region. The resistor, in some embodiments, is defined by vertical trenches, etched in the silicon substrate and physically separated from the rest of the device. The resistor can be confined between two trenches. The trenches used for confining the resistor may be similar to the types of trenches used to isolate SPADs. The resistor itself can be realized by creating a semiconducting layer by means of doping (opposite an epi layer type) confined between the trenches.

The resistance of such a channel can be easily defined by tuning the silicon doping level. In the case of ion implantation, resistors in the range of 1-107 Ohm are easily achievable by tuning energy and dose. The silicon resistor is connected to the device by simply overlapping the doped layer of the resistor with the doped region of the device, avoiding any contact opening process. At the other end, the resistor can be can be contacted to the metal grid by means of a Si/metal contact, opened through a dielectric layer. In such a design, a single dielectric layer deposition is required for the complete silicon photomultiplier realization. This feature is useful to optimize the anti-reflective coatings for some specific applications.

The proposed device can be fabricated with less process steps and fewer fabrication masks. This gives the benefit of a cost down on SPADs, silicon photomultipliers, and silicon photomultiplier modules. Due to the lower processing steps, the process risk also gets lower and the reliability and yield can be increased. Furthermore, the temperature stability of the conductance of a silicon resistor silicon photomultiplier as described herein is considered to be much better compared to traditional Poly-Si based resistors.

It should be appreciated that, in some embodiments, multiple different layouts can be realized to adapt and optimize the value of the resistor to the geometrical properties of the SPAD cell. Silicon resistors can run on one, two, three, or all four sides of the SPAD. Silicon resistors can be configured to only run on a short part of one sidewall also if a short resistor is already capable to have the correct value. This way, two resistors of neighboring cells can share the same SPAD border, thereby enhancing the Fill Factor (FF).

Figure 1B:
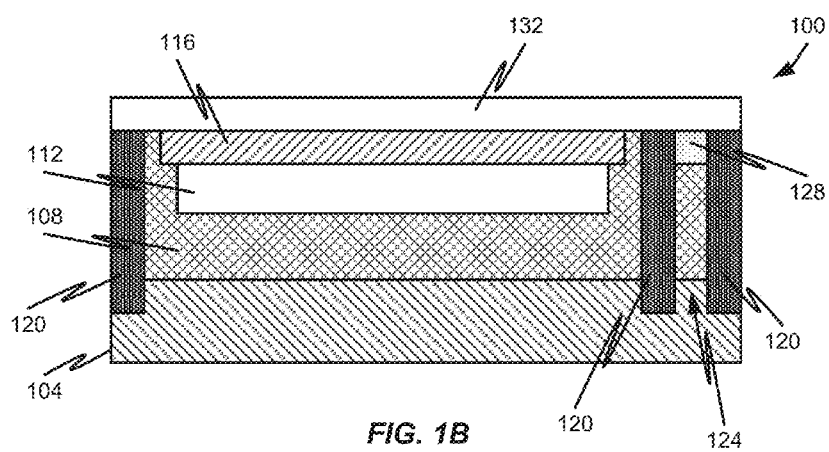
FIG. 1B is a cross-sectional view of the semiconductor device from FIG. 1A along line 1-1.

With reference initially to FIGS. 1A and 1B, a first illustrative semiconductor device 100 will be described in accordance with at least some embodiments of the present disclosure. The device 100 is shown to include a substrate 104 that supports an epitaxial layer 108 (e.g., "epi layer") along with a photodetector, which may also be referred to as a photodiode, small avalanche photodiode, SPAD, or the like. The photodetector is depicted to include an active area or photosensitive area 112 that converts light energy into an electrical signal. The semiconductor device 100 is also shown to include a conductive area 116 that provides a conductive/electrical connection between the photosensitive area 112 and a resistor 128. The conductive area 116 may correspond to a portion of the semiconductor device 100 that is in direct contact with the photosensitive area 112 whereas the resistor 128 may correspond to an electrically-conductive area that is electrically connected to the photosensitive area 112 through the conductive area 116. As mentioned above, the photosensitive area 112, in some embodiments, may correspond to a definite area that operates as an SPAD. As will be discussed in further detail herein, the semiconductor device 100 may include a plurality of SPADs that are connected together in a circuit via a metal line or trace 140. Each SPAD may be connected to the metal line or trace 140 via a dedicated resistor 128. Thus, the semiconductor device 100 may include a plurality of SPADs such as the one depicted in FIG. 1A, where each SPAD is connected to a common metal line or trace 140 through a resistor 128. FIG. 1A shows that the conductive area 116 may not necessarily be in direct contact with the trenches 120, although various configurations of the conductive area 116 with respect to the trenches 120 (e.g., direct or indirect electrical contact between the two) can be accommodated. Said another way, the epitaxial layer 108 may be used to separate the trenches 120 and the conductive area 116, although it may be possible to have other configurations.

In some embodiments, one or more trenches 120 are provided to separate the resistor 128 from direct contact with the photosensitive area 112. In some embodiments, the trenches 120 are also provided as a border around the photosensitive area 112 so as to delimit one photosensitive area 112 from an adjacent photosensitive area 112. It should be appreciated that the semiconductor device 100 may include one trench 120 having a spiraling configuration for each photosensitive area 112 as shown in FIG. 1A. Alternatively, the semiconductor device 100 may include a plurality of discrete trenches 120, some of which are used to separate adjacent photosensitive areas 116 and others of which are used to separate the resistor 128 from its associated photosensitive area 112.

As shown in FIG. 1B, even a single trench 120 like the one depicted in FIG. 1A may successfully separate the resistor 128 from the photosensitive area 112 while also separating adjacent photosensitive areas 116. In some embodiments, the trench 120 (or trenches) may correspond to a structure that extends completely through the epitaxial layer 108 and into the substrate 104. The trench 120 may have a top surface that is substantially coincident or flush with a top surface of the resistor 128 and a top surface of the conductive area 116. Although not visible from the cross-sectional view of FIG. 1B, it should be appreciated that the top surface of the trench 120 may also be coincident of flush with a top surface of the photosensitive area 112. These substantially coincident top surfaces may be in direct contact with a bottom surface of a cover 132, which may correspond to a lid, film, anti-reflective coating, or the like that is provided over the photosensitive area 112, conductive area 116, resistor 128, and trench(es) 120. The cover 132 may correspond to a structure that physically protects the other components of the semiconductor device 100 from environmental hazards, but that permits light (e.g., photons) or the like to pass therethrough and be detected by the photosensitive area 112. The cover 132 may alternatively or additionally include a dielectric layer that is deposited on the top surfaces of the photosensitive area 112, conductive area 116, trench(es) 120, and resistor 128.

The thickness or depth of the trench(es) 120 may be three of four times larger than the thickness or depth of the resistor 128. This sufficiently large difference in thicknesses will help to ensure that no unwanted electrical shorts are created through the epitaxial layer 108 or substrate 104. If the trench 120 correspond to a single structure as shown in FIG. 1A, then the thickness or depth of the trench 120 at various points throughout the semiconductor device 100 may be substantially uniform or constant. On the other hand, if the trench 120 include a plurality of discrete trench structures, then some of the trenches (e.g., a trench surrounding the photosensitive area 112) may have different depths or thicknesses from others of the trenches (e.g., a trench separating the resistor 128 from the photosensitive area 112).

In accordance with at least some embodiments, the epitaxial layer 108 may correspond to a semiconductor material that has a first doping (e.g., an N or P doping). The resistor 128 may also correspond to a semiconductor material that has a second doping, possibly opposite the doping of the epitaxial layer 108. As a non-limiting example, the epitaxial layer 108 and the resistor 128 may be formed of the same material (e.g., GaAs, GAP, or any other Group IV or Group V semiconductor) and, in some embodiments, the same layer of material may be oppositely doped in different portions to realize the separate epitaxial layer 108 and resistor 128. As an example, the epitaxial layer 108 may be an n-type semiconductor material whereas the resistor 128 may be a p-type semiconductor material. Any suitable type of known doping process or sequence of steps can be used to create the epitaxial layer 108 and resistor 128.

The photosensitive area 112 may correspond to any material or combination of materials, in a layered or unlayered format, that enables the production of one or more electrons in response to receiving one or more photons at the photosensitive area 112. Suitable examples of materials that can be used for the photosensitive area 112 may include, without limitation, Si, Ge, InGaAs, Pb S, MCT, or the like.

When a photon travels through silicon, it may be absorbed and transfer energy to a bound electron. This absorbed energy causes the electron to move from the valence band into the conduction band, creating an electron-hole pair. Silicon can be used absorb a wide range of wavelengths of light within a depth of a few tens of microns and so is well-suited as a photodetector material.

Applying a reverse bias to a photodiode sets up an electric field across the depletion region that will cause these charge carriers to the accelerated towards the anode (holes), or cathode (electrons). Therefore, an absorbed photon will result in a net flow of current in a reverse-biased photodiode.

When a sufficiently high electric field ($>5\times10^5$ V/cm) is generated within the depletion region of the silicon, a charge carrier created there will be accelerated to a point where it carries sufficient kinetic energy to create secondary charge pairs through a process called impact ionization. In this way, a single absorbed photon can trigger an ionization cascade that will spread throughout the silicon volume (e.g., the volume of the photosensitive area 112) subjected to the electric field. The silicon will break down and become conductive, effectively amplifying the original electron-hole pair into a macroscopic current flow.

The current flow created in the photosensitive area 112 will travel to the conductive area 116 and then to the resistor 128. The resistor 128 will carry the current to the metal line or trace 140 either directly or through a via established in the cover 132. For instance, a conductive via may be established in the cover 132 (e.g., if embodied as a dielectric layer), thereby creating an electrical path between the resistor 128 and metal line or trace 140.

In some embodiments, the metal line or trace 140 may be part of a larger metal grid that connects all of the different photosensitive areas 116 together in a circuit. Specifically, the semiconductor device 100 may include a plurality of photosensitive areas 116 laid out in an array or grid-type pattern and a corresponding grid of metal lines or traces 140 may be provided throughout the array of photosensitive areas 116.

Figure 2:
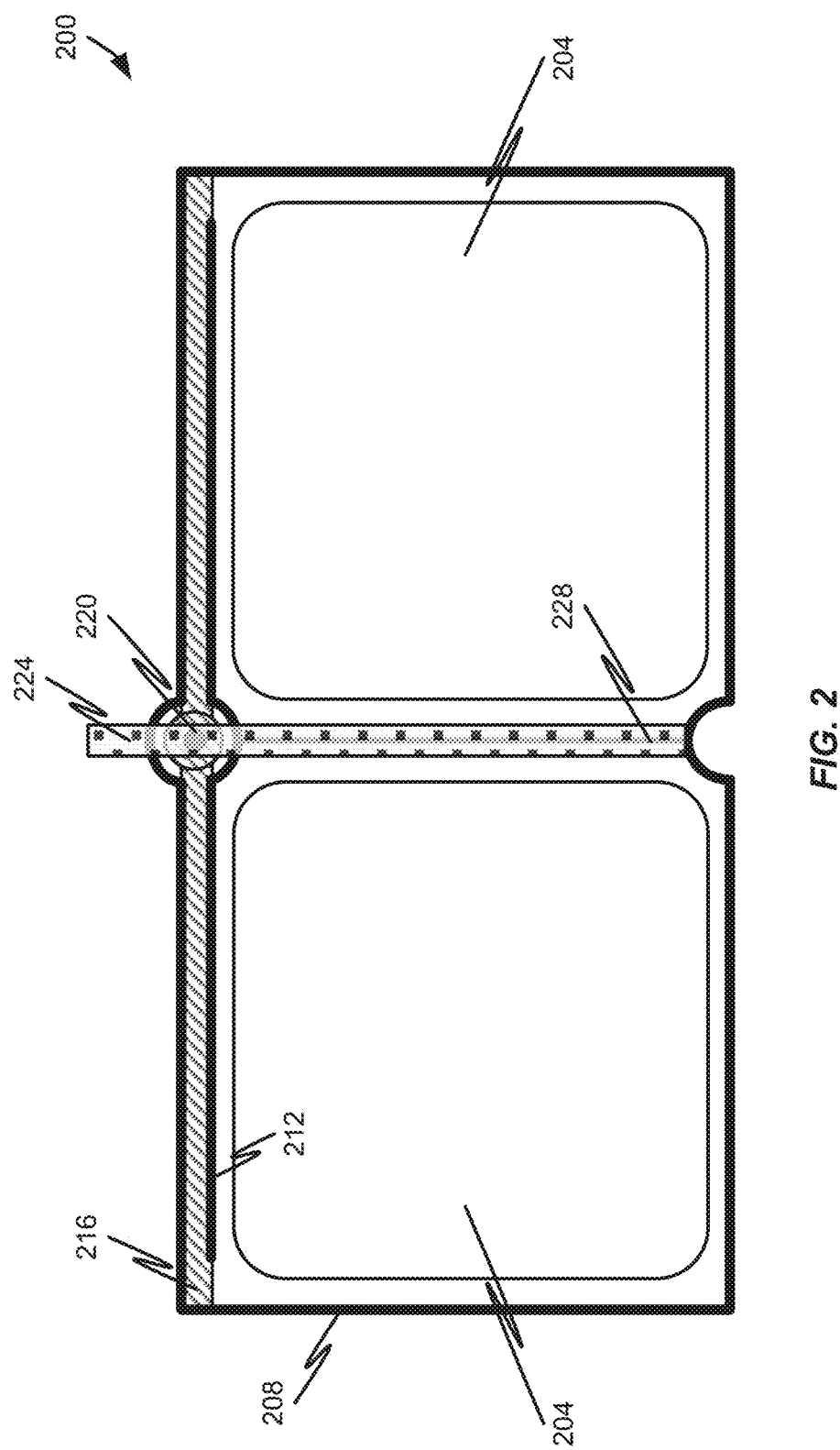
FIG. 2 is a top view of a second illustrative semiconductor device in accordance with at least some embodiments of the present disclosure.

FIG. 2 illustrates a second example of a semiconductor device 200 and provides a better appreciation for how photosensitive areas can be laid out in an array and a metal grid can be used to interconnect the various photosensitive areas. It should be appreciated that any of the features depicted or described in connection with FIGS. 1A and 1B can be utilized in combination with or in lieu of the features depicted or described in connection with FIG. 2, or vice versa.

The semiconductor device 200 of FIG. 2 is shown to include two adjacent photosensitive areas 204. A trench 228 is shown to electrically isolate one photosensitive area 204 from the other photosensitive area 204. The semiconductor device 200 is also shown to include trenches 208, 212. The trenches 208 surrounding the rest of the photosensitive areas 204 may be continuous or of the same depth as trench 228. The trench 212 is shown as an additional trench that provides isolation between the resistor 216 and the photosensitive area 204. Although not highlighted, the area surrounding the photosensitive area 204 may correspond to a conductive area that is used to carry electrical current from the photosensitive area 204 to the resistor 216. The resistor 216 in the embodiment of FIG. 2 is shown to border only one side of the photosensitive area 204, meaning that only one side of the photosensitive area 204 needs the trench 212 for purposes of separating the resistor 216 from the photosensitive area 204. It should be appreciated that the resistor 216 may require a greater length, in which case the resistor 216 may be extended around a second, third, or fourth side (or portions thereof) of the photosensitive area 216. In such a situation, the length of the trench 212 may be extended in a complimentary fashion to ensure that the resistor 216 is separated from the photosensitive area 204 and the connection between the two components is facilitated by the conductive area only.

FIG. 2 also depicts a metal line 224 extending over trench 228 (effectively covering the trench 228) and running perpendicular to the resistor 216. A metal contact or via 220 is shown that provides an electrical connection between the resistor 216 and the metal line 224. Interestingly, the metal contact or via 220 is shared between the adjacent photosensitive areas 204. Said another way, when current is generated in either photosensitive area 204, that current is carried to the common metal contact or via 220 and is subsequently provided to the metal line 224, which may be part of a larger metal grid. In some embodiments, the metal contact or via 220 provides a common electrical junction between the diodes created by the photosensitive areas 204.

Although not depicted, it should be appreciated that the adjacent photosensitive areas 204 may be reproduced to form an array or grid of photosensitive areas with pairs of adjacent photosensitive areas sharing a common metal contact or via 220. Metal lines 224 may carry current from each metal contact or via 220 in the array and create a circuit used for a silicon photomultiplier.

Figure 3:
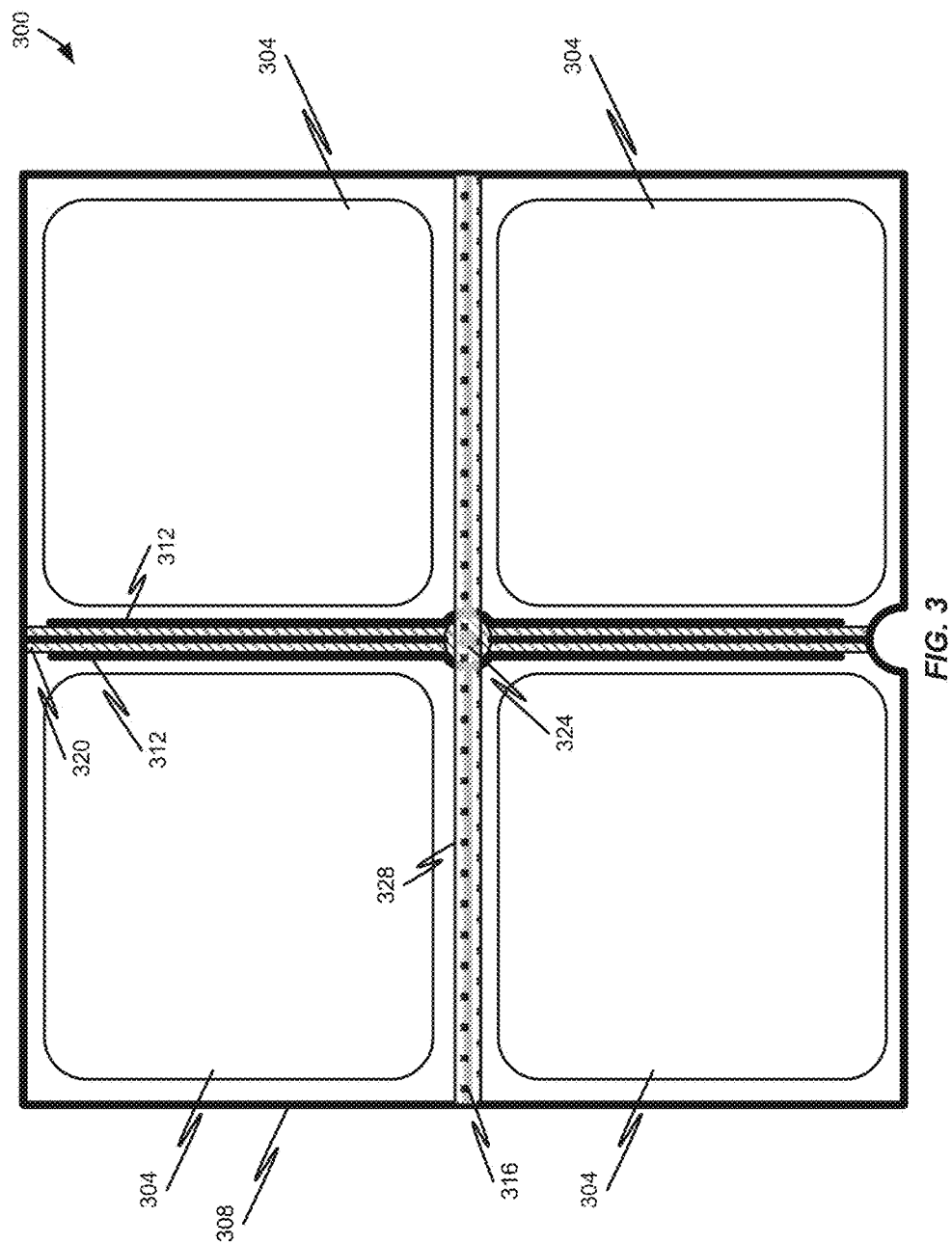
FIG. 3 is a top view of a third illustrative semiconductor device in accordance with at least some embodiments of the present disclosure.

Referring now to FIG. 3, another example of a semiconductor device 300 will be described in accordance with at least some embodiments of the present disclosure. Common or similar elements between semiconductor device 300 and any other semiconductor device (e.g., devices 100 or 200) may have similar or identical features. Moreover, any element of semiconductor devices 100, 200 may be used in connection with semiconductor device 300, or vice versa.

The semiconductor device 300 is shown to include four adjacent photosensitive areas 304 arranged in an array or grid-like format. The photosensitive areas 304 are surrounded by trenches 308, that electrically isolate the photosensitive areas 304 from other adjacent photosensitive areas that are not depicted in FIG. 3. The semiconductor device 300 is also shown to include trenches 312, 316. The trenches 312 are used to isolate the material of the resistor 320 from direct contact with material of the photosensitive areas 304. The trenches 316 are used to isolate the different photosensitive areas 304 in the semiconductor device 300 from one another.

In the depicted embodiment, the resistor 320 is shared between four photosensitive areas 304. A metal line 328 extends transversely with respect to the resistor 320 and the metal line 328 may be part of a larger metal grid. The resistor 320 is shown to be divided into four discrete portions, where each portion is responsible for carrying current to a metal contact or via 324 from a different photosensitive area 304. The resistor 320 is divided by at least the trench 320. The current generated in any one of the four photosensitive areas 304 may be carried to the commonly shared metal contact or via 324 by respective portions of the resistor 320. By enabling the sharing of a common metal contact or via 324 among four photosensitive areas 304 and by enabling the sharing of a resistor 320, the overall fill factor of the semiconductor device 300 can be greatly improved.

Although not depicted, it should be appreciated that the semiconductor device 300 may be replicated and create a larger grid or array of photosensitive areas with groups of four photosensitive areas sharing a common contact or via 324 as shown in FIG. 3. With such a duplication of photosensitive areas 304, the metal lines 328 may be interconnected to create a metal grid.

Figure 4:
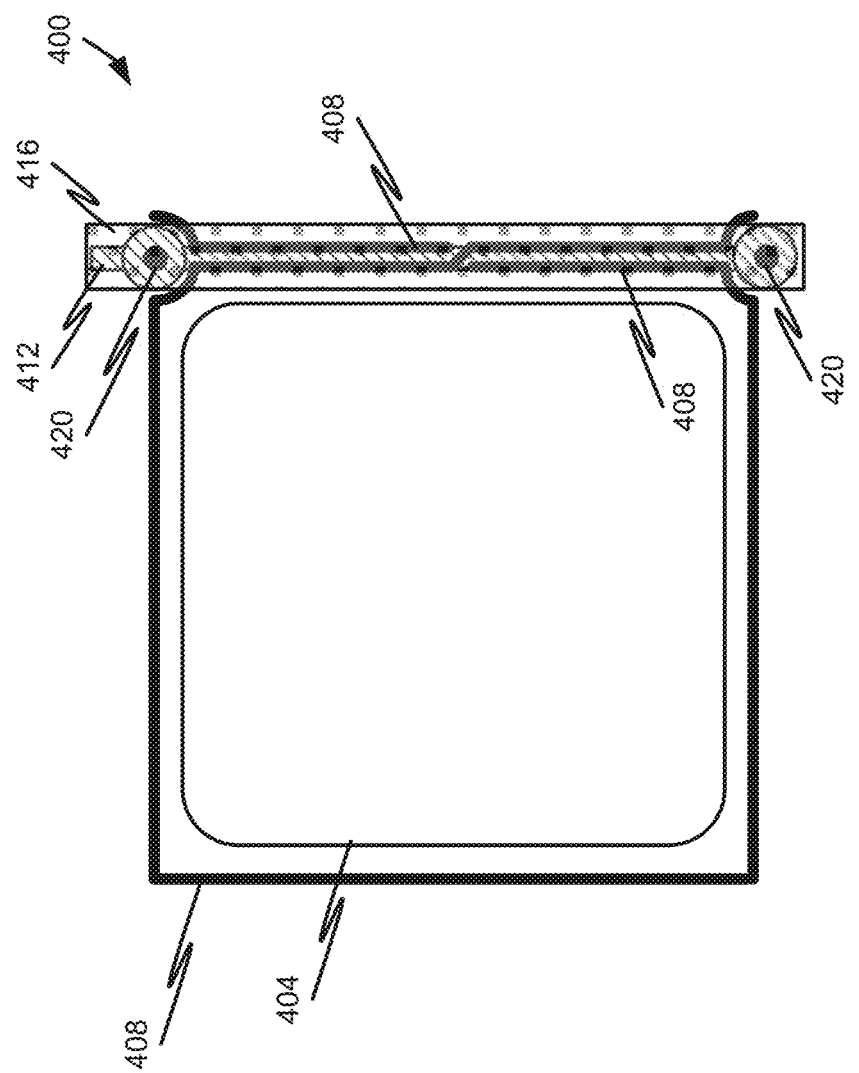
FIG. 4 is a top view of a fourth illustrative semiconductor device in accordance with at least some embodiments of the present disclosure.

With reference now to FIG. 4, another example of a semiconductor device 400 will be described in accordance with at least some embodiments of the present disclosure. Common or similar elements between semiconductor device 400 and any other semiconductor device (e.g., devices 100, 200, or 300) may have similar or identical features. Moreover, any element of semiconductor devices 100, 200, 300 may be used in connection with semiconductor device 400, or vice versa.

The semiconductor device 400 only depicts a single photosensitive area 404, but is should be appreciated multiple photosensitive areas 404 may be arranged in an array or grid-like format. Specifically, the semiconductor device 400 is designed to allow laterally-adjacent photosensitive areas 404 to share a resistor 412 without sharing a common metal contact or via 420. Imagine that a second photosensitive area 404 was positioned to the right of the depicted photosensitive area 404. The adjacent photosensitive areas would each generate their own electrical current in response to receiving one or more photons. The current generated in the depicted photosensitive area 404 (e.g., the left area) would travel to the resistor 412 by a conductive area and then travel to the lower metal contact or via 420. On the other hand, the current generated in the non-depicted photosensitive area (e.g., the right area) would travel to the resistor 412 by a conductive area and then travel to the upper metal contact or via 420. This is accomplished between the trench 408 used to separate the resistor 412 from the photosensitive area 404 is the same trench 408 used to separate the photosensitive area 404 from adjacent photosensitive areas.

Rather than using a resistor 412 that travels an entire length of the photosensitive area 412, only a portion of the resistor 412 is used for a particular photosensitive area 404. The division of the resistor 412 results in a shortening of the length of the resistor (as compared to having a resistor with a length approximately equal to a length of the side of the photosensitive area 404), which may be desirable depending upon the application of use for the semiconductor device 400. In some embodiments, pairs of photosensitive areas 404 may share an resistor 412 therebetween by having a divided trench 408 as shown. The metal line 416 is shown to extend over the resistor 412 as this may help improve the fill factor of the semiconductor device 400; however, it should be appreciated that such a configuration is not required. For instance, the metal line 416 may extend transverse/perpendicular to the resistor 412 without departing from the scope of the present disclosure.

Figure 5:
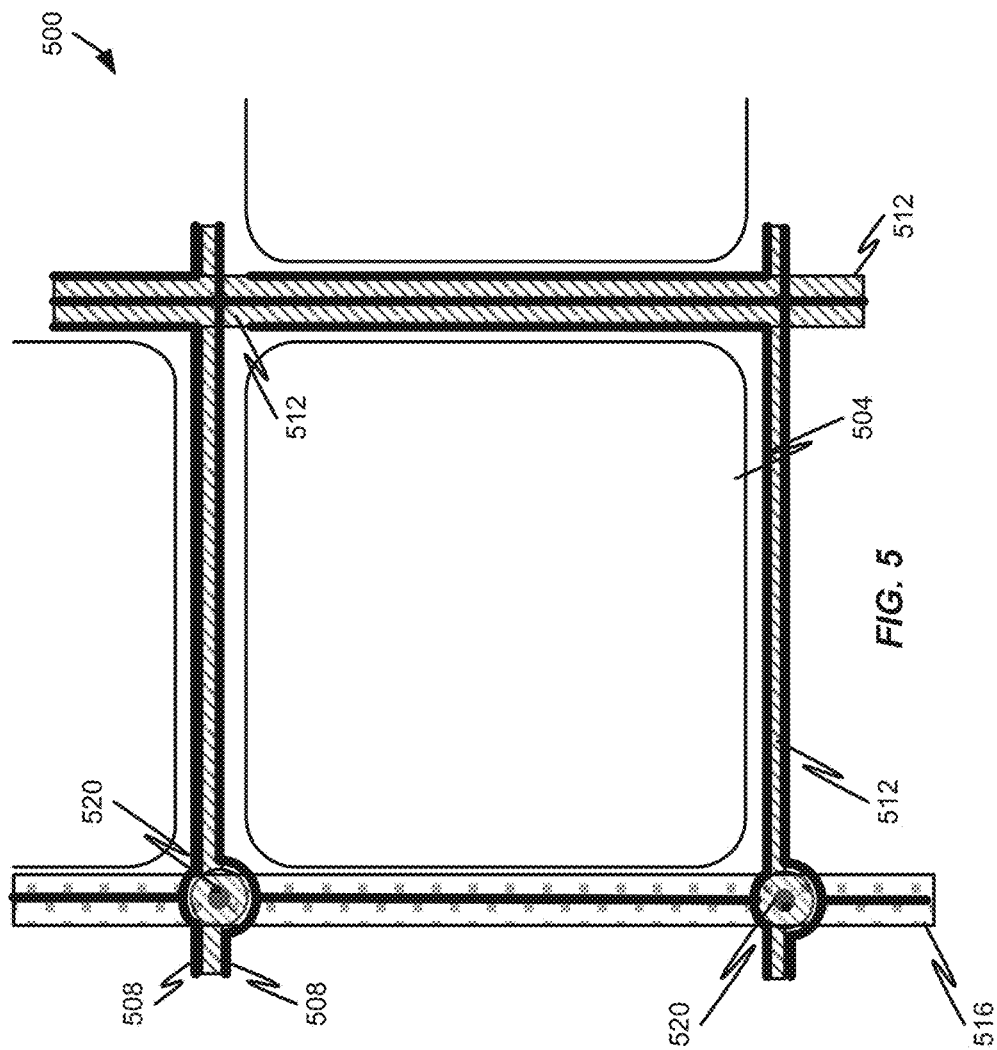
FIG. 5 is a top view of a fifth illustrative semiconductor device in accordance with at least some embodiments of the present disclosure.

With reference now to FIG. 5, another possible configuration of a semiconductor device 500 will be described in accordance with at least some embodiments of the present disclosure. Common or similar elements between semiconductor device 500 and any other semiconductor device (e.g., devices 100, 200, 300, or 400) may have similar or identical features. Moreover, any element of semiconductor devices 100, 200, 300, 400 may be used in connection with semiconductor device 500, or vice versa.

The semiconductor device 500 is shown to include a plurality of photosensitive areas 504 arranged in an array or grid-like pattern. Adjacent photosensitive areas 504 are isolated from one another by trenches 508. The trenches 508 also provide a physical separation between the photosensitive areas 504 and their corresponding resistors 512. In this depicted embodiment, the relative length of the resistor 512 is extended as compared to other previously-described configuration in that resistor 512 extends adjacent to two sides of a photosensitive area 504. Extending the length of the resistor 512 may help to increase the resistance of the resistor 512, if desired.

As with other semiconductor configurations, the resistor 512 may be electrically connected to a metal line 516 by a metal contact or via 520. As shown in FIG. 5, a metal contact or via 520 may receive electrical current from two different photosensitive areas 504, which are otherwise separated from one another by trenches 508. The resistors 512 are not shown to be significantly overlapped with the metal line 516, but it should be appreciated that the metal line 516 may extend over the resistor 512 in parallel (at least for a portion of the resistor 512) if desired. Furthermore, the metal line 516 may be part of a larger metal grid that forms a circuit for the silicon photomultiplier.

Figure 6:
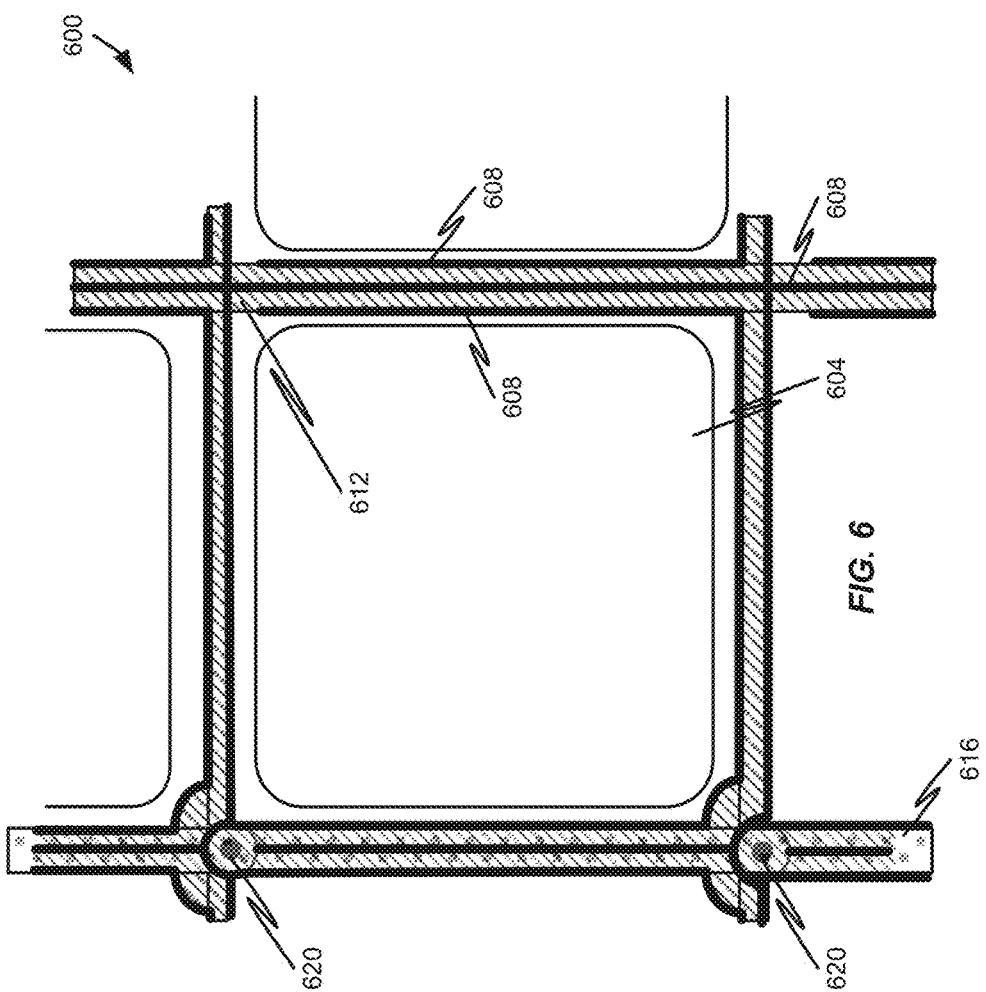
FIG. 6 is a top view of a sixth illustrative semiconductor device in accordance with at least some embodiments of the present disclosure.

With reference now to FIG. 6, yet another possible configuration of a semiconductor device 600 will be described in accordance with at least some embodiments of the present disclosure. Common or similar elements between semiconductor device 600 and any other semiconductor device (e.g., devices 100, 200, 300, 400, or 500) may have similar or identical features. Moreover, any element of semiconductor devices 100, 200, 300, 400, 500 may be used in connection with semiconductor device 600, or vice versa.

The semiconductor device 600 is shown to include a plurality of photosensitive areas 604 much like semiconductor device 500. The resistor 612 is shown to traverse three sides of the photosensitive area 604. A trench 608 spans the length of the resistor 612 and separates the resistor 612 from direct physical contact with the photosensitive area 604. The semiconductor device 600 also exhibits a trench 608 or series of trenches that separate adjacent photosensitive areas 604. Interestingly in this configuration, each photosensitive area 604 is completely surrounded by a resistor 612. Three sides of the photosensitive area 604 are surrounded by the resistor 612 with which the photosensitive area 604 is in electrical communication while the fourth side of the photosensitive area 604 is adjacent to a resistor 612 for another photosensitive area.

The semiconductor device 600 is similar to other devices depicted and described herein that have a metal contact or via 620 that is shared between multiple photosensitive areas 604. For instance, the top-most metal contact or via 620 depicted in FIG. 6 is shared between the central photosensitive area 604 and a photosensitive area that would be positioned to the adjacent left of the central photosensitive area 604. The shared metal contact or via 620 provides an electrical connection between the two resistors 612 of each photosensitive area 604 and a metal line 616 that extends over the metal contacts or vias 620. The metal line 616 may extend vertically or horizontally with respect to the grid or array of photosensitive areas without departing from the scope of the present disclosure.

Figure 7:
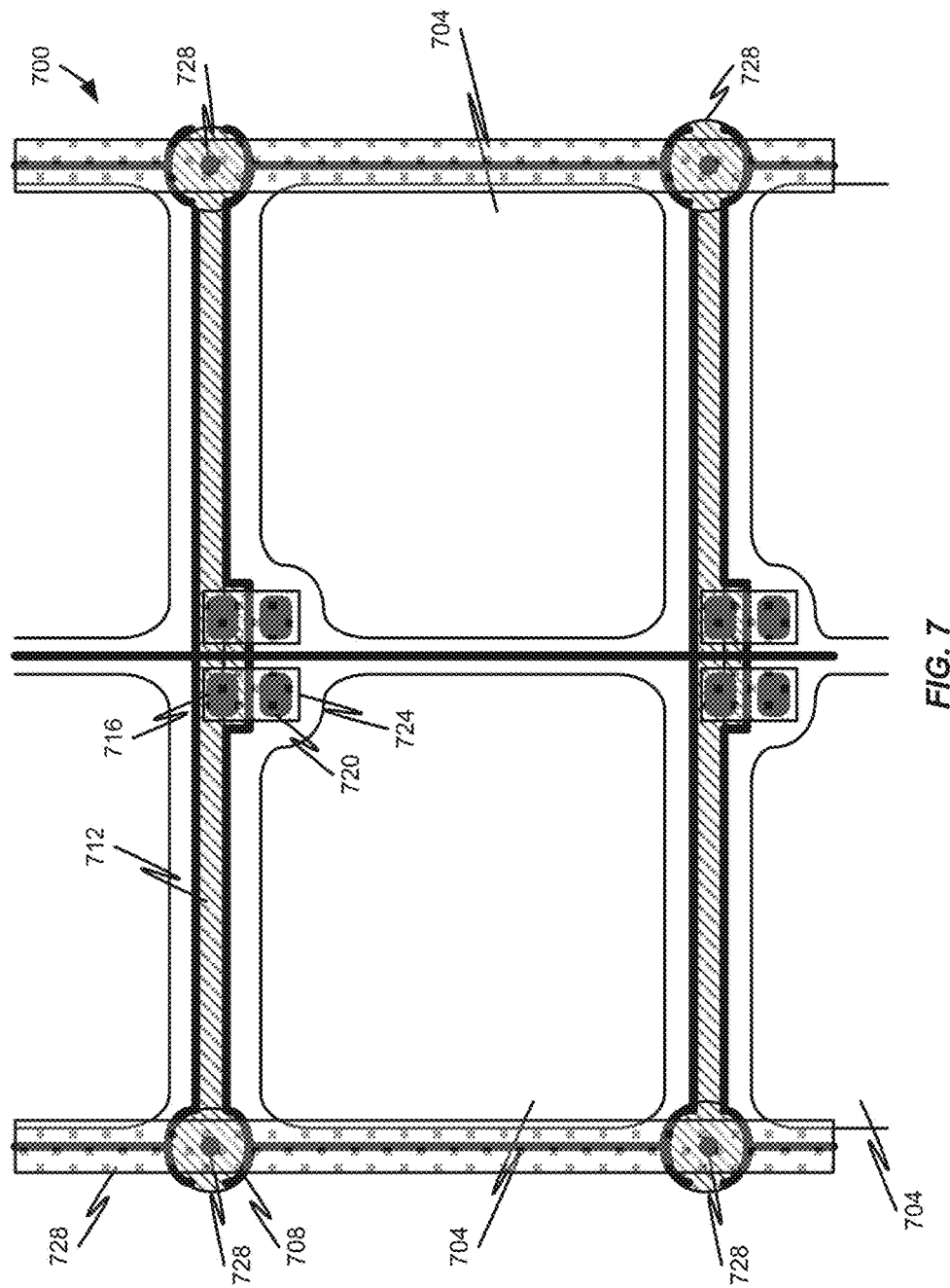
FIG. 7 is a top view of a seventh illustrative semiconductor device in accordance with at least some embodiments of the present disclosure.

With reference now to FIG. 7, another configuration of a semiconductor device 700 will be described in accordance with at least some embodiments of the present disclosure. Common or similar elements between semiconductor device 700 and any other semiconductor device (e.g., devices 100, 200, 300, 400, 500, or 600) may have similar or identical features. Moreover, any element of semiconductor devices 100, 200, 300, 400, 500, 600 may be used in connection with semiconductor device 700, or vice versa.

The semiconductor device 700 is shown to include a plurality of photosensitive areas 704 arranged in an array or grid-type format. Each photosensitive area 704 is physically separated from direct contact with a corresponding resistor 712 by trenches 708. In this particular embodiment, the electrical communication between a photosensitive area 704 and resistor 712 is facilitated by a pair of electrical contacts or vias 716, 720 and a shortened metal line or trace 724. The shortened metal line or trace 724 may be similar to the longer metal line 728 except that the shortened metal line or trace 724 is not part of a larger metal grid. To the contrary, the shortened metal line or trace 724 is only used to provide an electrical connection between the pair of electrical contacts or vias 716, 720, which may extend through the cover 132. This particular configuration of a semiconductor device 700 may be useful to improve the overall fill factor of the device 700 even though it requires slightly more components in the form of additional contacts or vias 716, 720.

Each resistor 712 is also connected to a metal contact or via 728 that provides electrical connectivity to the metal line 728. As shown in FIG. 7, the metal line 728 may extend partially over the photosensitive area 704, although such a configuration is not a requirement. This configuration of device 700 also realizes a resistor 712 having a length that is substantially similar to the length of resistor depicted in connection with device 200. Also similar to device 200, the device 700 has a metal contact or via 728 that is shared among at least two resistors 712 communicating with two different, but adjacent photosensitive areas 704.

Figure 8:
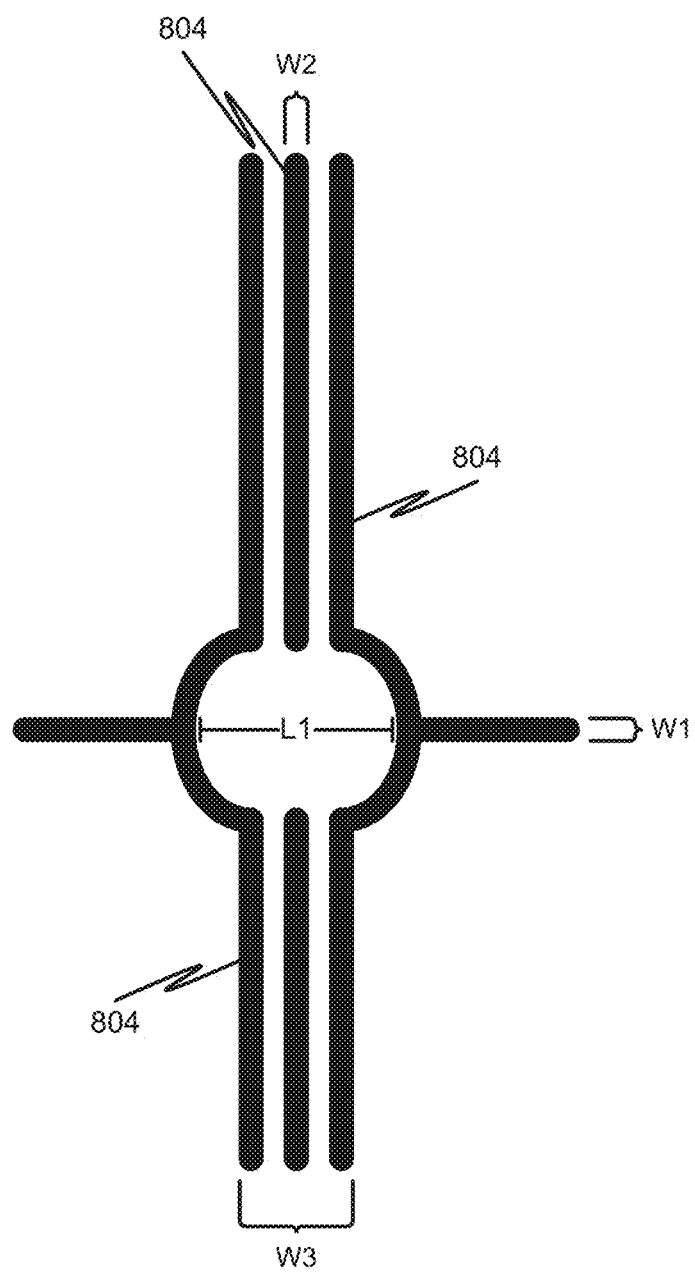
FIG. 8 is a detailed view of trench dimensions in accordance with at least some embodiments of the present disclosure.

With reference now to FIG. 8, additional details of trench designs and dimensions will be described in accordance with at least some embodiments of the present disclosure. Specifically, the illustrative trenches 804 are shown to have particular configuration, but this configuration is only for illustrative purposes. It should be appreciated that any of the trenches depicted and/or described herein may have dimensions similar or identical to the dimensions of trenches 804 shown in FIG. 8.

Specifically, each trench 804 may have a trench width W1, W2. It should be appreciated that the trench width W1 of trenches dividing adjacent photosensitive areas may be the same or identical as the trench width W2 of trenches dividing a resistor or separating a resistor from an adjacent photosensitive area. As a non-limiting example, the trench width W1, W2 may be anywhere between approximately 0.55 um and 0.7 um, or more specifically between approximately 0.65 um and 0.68 um.

The semiconductor devices may also have a resistor width W3 that can be varied depending upon a desired resistance of the resistor and/or the desired fill factor for the semiconductor device. As a non-limiting example, the resistor width W3 may be anywhere between approximately 3.5 um and 4.0 um, or more specifically between approximately 3.78 um and 3.93 um.

The semiconductor devices may also have via diameters L1 established between trenches 804 that enable the acceptance of a metal contact or via, thereby facilitating an electrical connection between a resistor in silicon and the overlying metal layer provided on a cover of the semiconductor device. As a non-limiting example, the via diameter L1 may vary anywhere between approximately 5.0 um and 5.5 um, or more specifically between approximately 5.02 um and 5.1 um. It should be appreciated that the dimensions of the trenches, resistors, and/or metal contacts or vias may be adapted to accommodate a desired application without departing from the scope of the present disclosure.

Figure 9:
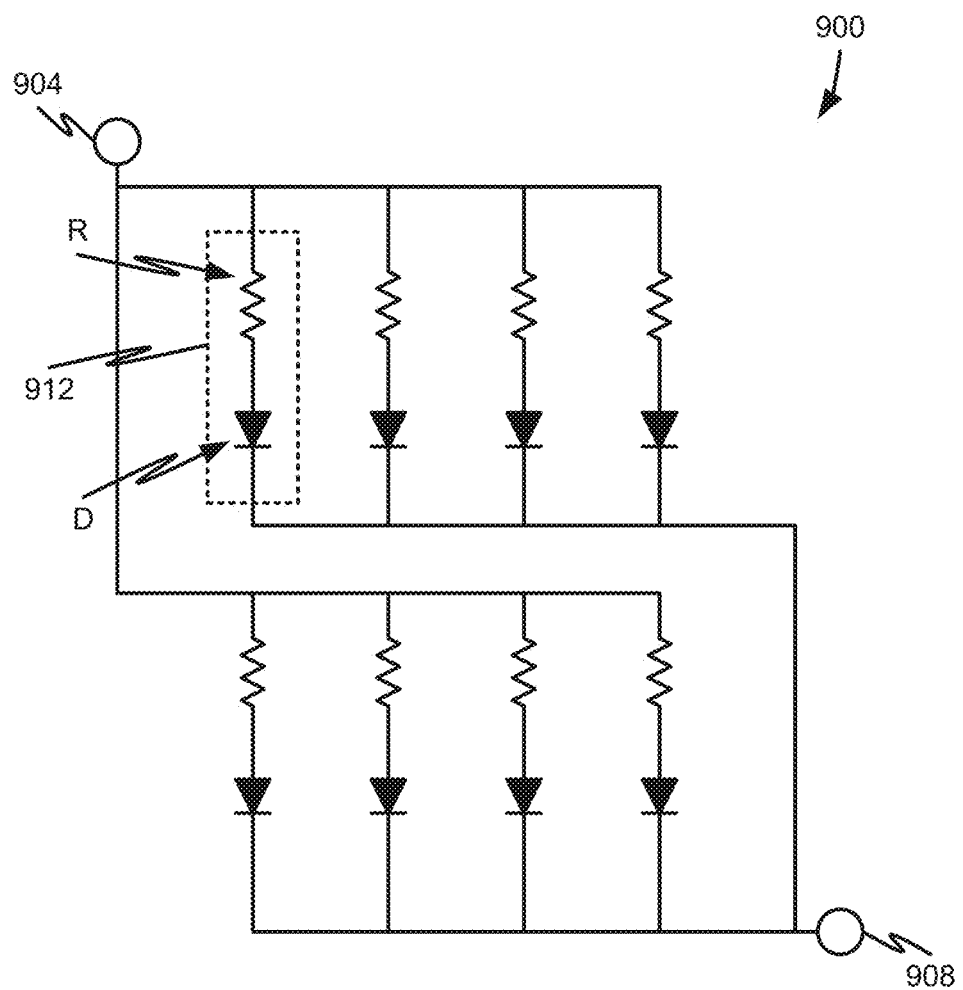
FIG. 9 is a circuit diagram depicting an illustrative silicon photomultiplier in accordance with at least some embodiments of the present disclosure.

With reference now to FIG. 9, an illustrative circuit 900 will be described in accordance with at least some embodiments of the present disclosure. The circuit 900 is shown to include an anode 904 and a cathode 908. The circuit 900 is shown to include a plurality of photosensor units 912 arranged in parallel with one another. Each photosensor unit 912 may include a quenching resistor R and a diode D. The diode D may be created, at least in part, with any of the photosensitive areas depicted and described herein. The quenching resistor R may be created, at least in part, with any of the silicon resistors depicted and described herein, where the silicon resistor is physically separated from the photosensitive area(s) with a trench or number of trenches. It should be appreciated that the anode 904 or cathode 908 may operate as the circuit 900 output and the other of the anode 904 or cathode 908 may operate as the circuit 900 input.

In some embodiments, the photosensor units 912 have their output summed (by virtue of being connected in parallel) to provide an overall semiconductor device or silicon photomultiplier output. In some embodiments, the output of the circuit 900 provides information on the magnitude of an instantaneous photon flux received at the photosensitive areas (e.g., diodes D). The circuit 900 effectively represents a plurality of small avalanche photodiodes (e.g., photosensor units 912) connected in parallel with one another, where each of the plurality of small avalanche photodiodes are provided with a quenching resistor R, and each of the quenching resistors are connected with one another, and where each quenching resistor R is separated from a corresponding photosensitive area by one or more trenches that also confine the quenching resistor R therebetween. As stated above, any of the semiconductor device configurations described herein can be used to create the circuit 900 depicted in FIG. 9.

As can be appreciated, any of the semiconductor devices depicted and described herein may be implemented as on-chip solutions (e.g., as a single silicon wafer). In some embodiments, the silicon photomultiplier may be implemented in an Integrated Circuit (IC) chip having other circuit elements provided therein.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A semiconductor device, comprising:
a substrate;
a photosensitive area provided on the substrate, the photosensitive area corresponding to an area in which an electrical signal is generated in response to light impacting the photosensitive area;
at least one trench substantially surrounding the photosensitive area, the at least one trench extending at least partially into the substrate; and
a resistor comprising a doped semiconductor material that is confined by the at least one trench and in electrical communication with the active area such that the resistor is configured to carry electrical signals generated by the photosensitive area to a metal contact.

2. The semiconductor device of claim 1, further comprising:
an epitaxial layer positioned between the substrate and the photosensitive area, wherein the at least one trench extends completely through the epitaxial layer.

3. The semiconductor device of claim 2, wherein the semiconductor material of the resistor is doped opposite to a doping of the epitaxial layer.

4. The semiconductor device of claim 1, wherein the resistor comprises a resistance between 1 Ohm and 10 Ohm.

5. The semiconductor device of claim 1, further comprising:
a metal grid established over the substrate, wherein the metal grid is in electrical communication with the metal contact and is configured to carry the electrical signal generated by the photosensitive area.

6. The semiconductor device of claim 5, wherein the metal contact comprises a silicon/metal contact and wherein the metal contact is contacted with the metal grid through an opening in a dielectric layer.

7. The semiconductor device of claim 1, wherein the resistor comprises a quenching resistor.

8. The semiconductor device of claim 1, further comprising:
an anti-reflective coating provided over at least the photosensitive area.

9. A sensor, comprising:
one or more semiconductor devices, each of the one or more semiconductor devices comprising:
a substrate;
a photosensitive area provided on the substrate, the photosensitive area corresponding to an area in which an electrical signal is generated in response to light impacting the photosensitive area;
at least one trench substantially surrounding the photosensitive area, the at least one trench extending at least partially into the substrate; and
a resistor comprising a doped semiconductor material that is confined by the at least one trench and in electrical communication with the active area such that the resistor is configured to carry electrical signals generated by the photosensitive area to a metal contact.

10. The sensor of claim 9, wherein each of the one or more semiconductor devices further comprise a first single-photon avalanche diodes (SPAD) and a second SPAD that are adjacent to one another and have a metal line that borders both the first SPAD and second SPAD.

11. The sensor of claim 10, wherein the metal contact is in electrical communication with the metal line.

12. The sensor of claim 9, wherein the semiconductor material of the resistor is doped opposite to a doping of an epitaxial layer that is positioned between the substrate and the photosensitive area, and wherein the trench extends completely through the epitaxial layer.

13. The sensor of claim 9, wherein the resistor comprises a resistance between 1 Ohm and 10 Ohm.

14. The sensor of claim 9, wherein each of the one or more semiconductor devices further comprise:
a metal grid established over the substrate, wherein the metal grid is in electrical communication with the metal contact and is configured to carry the electrical signal generated by the photosensitive area.

15. The sensor of claim 14, wherein the metal contact comprises a silicon/metal contact and wherein the metal contact is contacted with the metal grid through an opening in a dielectric layer.

16. The sensor of claim 9, wherein the resistor comprises a quenching resistor.

17. The sensor of claim 9, wherein each of the one or more semiconductor devices further comprise:
   an anti-reflective coating provided over at least the photosensitive area.

18. The sensor of claim 9, wherein a first resistor of a first semiconductor device in the one or more semiconductor devices shares a common border with a second resistor of a second semiconductor device in the one or more semiconductor devices.

19. The sensor of claim 9, wherein the photosensitive area, the at least one trench, and the resistor are provided as part of a single-photon avalanche diode (SPAD).

* * * * *